United States Patent [19]

Hartnagel et al.

[11] 4,119,993
[45] Oct. 10, 1978

[54] GAAS MOSFET

[75] Inventors: Hans Ludwig Hartnagel; Burhan Bayraktaroglu, both of Newcastle-upon-Tyne, England

[73] Assignee: National Research Development Corporation, London, England

[21] Appl. No.: 755,845

[22] Filed: Dec. 30, 1976

[30] Foreign Application Priority Data

Jan. 16, 1976 [GB] United Kingdom ............... 1738/76

[51] Int. Cl.$^2$ ............................................. H01L 29/78
[52] U.S. Cl. ........................................ 357/23; 29/571;
29/590; 148/188; 204/15; 204/42
[58] Field of Search ................. 357/23; 29/571, 578,
29/590; 204/15, 42; 148/188

[56] References Cited

U.S. PATENT DOCUMENTS

| | | | |
|---|---|---|---|
| 3,756,924 | 9/1973 | Collins | 204/15 |
| 3,866,311 | 2/1975 | Salles | 204/15 |
| 3,929,589 | 12/1975 | Ermanis | 204/15 |
| 3,987,538 | 10/1976 | Brown | 29/590 |

Primary Examiner—W. Tupman
Attorney, Agent, or Firm—Cushman, Darby & Cushman

[57] ABSTRACT

A GaAs mosfet comprises a p-type gallium arsenide single crystal having two grooves formed therein, each groove containing a layer of indium, a layer of dopant overlying the indium and a layer of $Al_2O_3$ overlying the dopant, each groove overlying a respective $n^+$ region of the gallium arsenide, the surface of the gallium arsenide single crystal on each side of each groove comprising native oxide to a depth contiguous to the $n^+$ regions, and the layers of dopant being in contact with the junctions between the $n^+$ regions and the native oxides. A flat contact pad covers the native oxide between the grooves and is in contact with the $Al_2O_3$ of both grooves, a second contact pad covers the native oxide on the remaining side of one groove and is in contact with the dopant via an electrically ruptured part of the $Al_2O_3$ of that one groove, and a third contact pad covers the native oxide on the remaining side of the other groove and is in contact with the dopant via an electrically ruptured part of the $Al_2O_3$ of that other groove.

11 Claims, 1 Drawing Figure

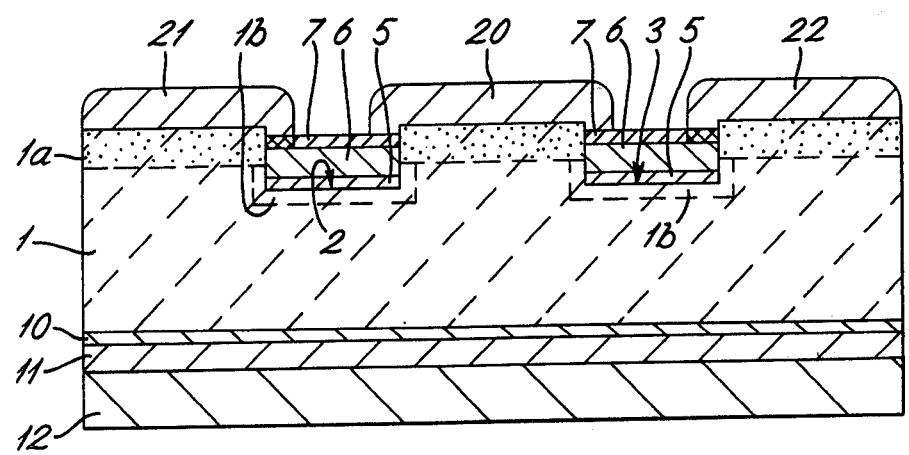

GAAS MOSFET

This invention relates to a GaAs mosfet and to a method of making a GaAs mosfet and to a mosfet when made by the method. A mosfet is a metal-oxide semiconductor field-effect transistor.

The invention accordingly provides a GaAs mosfet comprising a p-type gallium arsenide single crystal having two grooves formed therein, each groove containing a layer of indium, a layer of dopant overlying the indium and a layer of $Al_2O_3$ overlying the dopant, each groove overlying respective $n^+$ region of the gallium arsenide, the surface of the gallium arsenide single crystal on each side of each groove comprising native oxide to a depth contiguous to the $n^+$ regions, the layers of dopant being in contact with the junctions between the $n^{30}$ regions and the native oxides, there being provided a flat contact pad covering substantially all the native oxide between the grooves and in contact with the $Al_2O_3$ of both grooves, a second contact pad covering the native oxide on the remaining side of one groove and in contact with the dopant via an electrically ruptured part of the $Al_2O_3$ of that one groove, and a third contact pad covering the native oxide on the remaining side of the other groove and in contact with the dopant via an electrically ruptured part of the $Al_2O_3$ of that other groove.

The three contact pads are preferably each of silver. The gallium arsenide single crystal may bear, on a face remote from the grooves, successive layers one of indium and one or more of metals forming ohmic contacts with the p-type gallium arsenide for example one layer of zinc and one layer of silver. The silver overlying the zinc may be connected to a contact wire and to heat sink. Usually, the native oxide under the first contact pad extends continuously from one groove to the other. The invention further provides a method of making a GaAs mosfet, the method comprising:

forming two grooves in a surface of a p-type gallium arsenide single crystal, depositing in each groove a layer of indium, depositing over the indium in each groove a layer of a dopant, depositing over the dopant a layer of aluminium, anodically oxidising the surface of the work until all the aluminium is oxidised to $Al_2O_3$ and the gallium arsenide is oxidised to a depth contiguous to the dopant, annealing the work to form an $n^+$ layer in the gallium arsenide under the grooves and contiguous with the anodically oxidised gallium arsenide, depositing contact metal simultaneously or in any order (i) covering substantially all the anodically oxidised gallium arsenide between the grooves and in contact with both of the layers of $Al_2O_3$, (ii) covering the anodically oxidised gallium arsenide on the remaining side of one groove and in contact with the $Al_2O_3$ of that one groove, and (iii) covering the anodically oxidised gallium arsenide on the remaining side of the other groove and in contact with the $Al_2O_3$ of that other groove, and rendering electrically conductive $Al_2O_3$ between the dopant and the contact metal (ii) and (iii). The method may further comprise, before or after the annealing, depositing, on a face of the gallium arsenide single crystal remote from the grooves, a layer of indium and layer(s) of metal(s) forming ohmic contacts with the p-type gallium arsenide, for example a layer of zinc adjacent the indium and a layer of silver overlying the zinc.

The dopant may be for example germanium and is conveniently tin.

The contact metal is preferably silver. The annealing preferably lasts from 1 to 10 minutes at a temperature preferably of 300° to 650° C., preferably over 500° C., e.g. 600° C., and is performed in an atmosphere most preferably of nitrogen. Conveniently, the $Al_2O_3$ between the dopant and the contact metal (ii) and (iii) is rendered conductive by applying thereto a voltage sufficient to break down the $Al_2O_3$ but insufficient to break down the anodically oxidised gallium arsenide.

The indium may be deposited by evaporation, e.g. by using a photoresist float-off method. The invention also extends to a GaAs mosfet when made by the method set forth above.

A method according to the invention will now be described by way of example (whereby a mosfet according to the invention will also be described) with reference to the accompanying drawing which shows a cross-section of a mosfet according to the invention.

Into a single-crystal block 1 of GaAs (gallium arsenide) of p-type having a hole density of p = $5 \times 10^{16} cm^{-3}$ are etched two parallel channels 2, 3 both 2000Å deep, by conventional photolithography and applying an etch solution comprising (by volume) 20 parts $H_2O$, 4 parts $H_2O_2$ and 1 part of "0.88" $NH_4OH$, for 15 seconds.

Without removing the photoresist which protected all except the channel areas of the block 1, indium is evaporated on to the block and is accordingly deposited only in the channels 2 and 3, where it forms a layer 5 200Å thick. Thereafter a layer 6, 1000Å thick, of tin is deposited, followed by a layer 7 of aluminium 500Å thick. The layer 5 acts as a wetting or fluxing agent to assist good adhesion of the subsequent layers.

The face of the block 1 including the channels 2, 3 is now subjected to anodic oxidation as described in UK patent application No. 52160/74, that is, in an electrolyte containing for example a mixture of ethylene glycol and 1 part of a 3% by weight aqueous solution of tartaric acid (which aqueous solution was first adjusted using ammonia to a pH of, say, 6), for about 40 or 50 minutes at an initial current density not exceeding $1mA/cm^2$, e.g. around $0.5mA/cm^2$. The initial current density must be as low as possible in order that the subsequent annealing (to be described) should give the best results. The anodic oxidation creates simultaneous growth of native GaAs oxide from the block 1 and of $Al_2O_3$ from the layer 7 of aluminium. The anodic oxidation is continued until all of the layer 7 is converted into $Al_2O_3$, at which instant a detectable change in anodisation current does, conveniently, occur. From the known relative oxidation rates of Al and GaAs, the thickness of the native GaAs oxide is deduced to be about 1000Å at this instant, the GaAs oxide being shown as dotted region 1a in the drawing. This anodic oxidation method yields a native GaAs oxide stable enough to withstand the next steps.

On the face of the block 1 opposite the channels 2, 3 are evaporated, in order, a layer 10 of indium 200Å thick, a layer 11 of zinc 1000Å and a layer 12 of silver 2000Å thick.

As the next step, the block 1 is annealed for 5 minutes at 600° C. in nitrogen, which is preferable to such atmospheres as hydrogen, oxygen, or argon. This annealing has three purposes: (i) to produce $n^+$ layers (shown as a shaded region 1b in the drawing) by thin phase epitaxy, wherein no arseniferous overpressure is required, thanks to the Al₂O₃ layer 7; (ii) to create good electrical interface conditions between the GaAs and the native GaAs oxide; and (iii) to render the back contact (the layers 10, 11 and 12) ohmic. A MOS (metal-oxide semiconductor) sandwich is thus formed.

A second selective evaporation is now performed, whereby silver is deposited at discrete regions 20, 21 and 22, where 20 covers the region between the channels 2 and 3 and partly encroaches on both, and 21 and 22 contact separate parts of the channels 2 and 3 respectively together with the remainder of that face of the block 1. These regions are used as contact pads for receiving e.g. wires, 20 being known as the gate, 21 as the source and 22 as the drain.

To form good contacts between the source 21 and the respective n⁺ layer 1b and between the drain 22 and the respective n⁺ layer 1b, a breakdown voltge of 50V is applied to the source 21 and then to the drain 22, thus creating a field of $10^7$V/cm across the Al₂O₃ layer 7, which breaks down at those parts thereof shown crosshatched. Experiments show that the GaAs native oxide layer 1a does not break until 80V are applied (a field of $8 \times 10^6$V/cm).

Either before or after this Al₂O₃ breakdown step, wires are bonded to the three silver contact pads 20, 21 and 22 and a contact and a heat-sink are applied to the layer 12.

The top surface (as drawn) of the block 1 thus consists only of silver and Al₂O₃, which are both relatively inert, mechanically strong and non-volatile, thus protecting the underlying layer structure from volatilisation, chemical break-down of the GaAs oxide and mechanical abrasion. The Al₂O₃ layers in addition provide the gate 20 with an overlap, as required, over the n⁺ layers 1B.

We claim:

1. A method of making a GaAs mosfet, the method comprising forming two grooves in a surface of a p-type gallium arsenide single crystal, depositing in each groove a layer of indium, depositing over the indium in each groove a layer of dopant, depositing over the dopant a layer of aluminium, anodically oxidising the surface of the work until all the aluminium is oxidised to Al₂O₃ and the gallium arsenide is oxidised to a depth contiguous to the dopant, annealing the work to form an n⁺ layer in the gallium arsenide under the grooves and contiguous with the anodically oxidised gallium arsenide, in any order depositing contact metal (i) covering substantially all the anodically oxidised gallium arsenide between the grooves and in contact with both of the layers of Al₂O₃, (ii) covering the anodically oxidised gallium arsenide on the remaining side of one groove and in contact with the Al₂O₃ of that one groove, and (iii) covering the anodically oxidised gallium arsenide on the remaining side of the other groove, and rendering electrically conductive Al₂O₃ between the dopant and the contact metal (ii) and (iii).

2. The method of claim 1, further comprising, at any stage, depositing successively, on a face of the gallium arsenide single crystal remote from the grooves, a layer each of indium and of metal(s) forming ohmic contacts with the p-type gallium arsenide.

3. The method of claim 2, further comprising connecting the metal overlying the indium and forming the ohmic contact to a contact wire and a heat sink.

4. The method of claim 2, wherein the metals forming the ohmic contact are zinc adjacent the indium, and silver overlying the zinc.

5. The method of claim 1, wherein the contact metal is silver.

6. The method of claim 1, wherein the annealing lasts from 1 to 10 minutes.

7. The method of claim 1, wherein the annealing is at a temperature of 300° to 650° C.

8. The method of claim 7, wherein the annealing is at a temperature of over 500° C.

9. The method of claim 1, wherein the annealing is performed is an atmosphere of nitrogen.

10. The method of claim 1, wherein the Al₂O₃ between the dopant and the contact metal (ii) and (iii) is rendered conductive by applying thereto a voltage sufficient to break down the Al₂O₃ but insufficient to break down the anodically oxidised gallium arsenide.

11. A GaAs mosfet produced by the method of claim 1.

* * * * *